US010601212B2

United States Patent
Lin et al.

(10) Patent No.: US 10,601,212 B2
(45) Date of Patent: Mar. 24, 2020

(54) AIRFLOW SEALING SOLUTION

(71) Applicant: Dell Products, L.P., Round Rock, TX (US)

(72) Inventors: Kuang Hsi Lin, Bade (TW); Jui Hai Peng, Pingzhen (TW); Hung-Wen Wu, New Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/605,397

(22) Filed: May 25, 2017

(65) Prior Publication Data
US 2018/0343765 A1 Nov. 29, 2018

(51) Int. Cl.
| H05K 7/14 | (2006.01) |
| H05K 7/20 | (2006.01) |
| H02G 15/013 | (2006.01) |
| H05K 5/06 | (2006.01) |
| H02G 3/22 | (2006.01) |

(52) U.S. Cl.
CPC .......... *H02G 15/013* (2013.01); *H05K 5/069* (2013.01); *H05K 7/20727* (2013.01); *H02G 3/22* (2013.01)

(58) Field of Classification Search
CPC . G06F 1/20; G06F 1/187; G06F 1/181; G06F 1/183; G06F 1/182; H05K 7/20172; H05K 7/20727; H05K 7/20181; H05K 7/20736; H05K 7/20145; H05K 7/1491; H05K 7/20136; H05K 7/20563; H05K 7/20718; H05K 5/0208; H05K 7/2019; H05K 5/0213; H05K 5/0247; H05K 7/20909; H02G 15/013
See application file for complete search history.

(56) References Cited

U.S. PATENT DOCUMENTS

| 2,396,836 | A | * | 3/1946 | Ellinwood | ............ F16L 3/2235 174/135 |
| 3,229,026 | A | * | 1/1966 | Sulzer | .................. H02G 3/0616 16/2.1 |
| 5,245,131 | A | * | 9/1993 | Golden | .................. H02B 1/305 174/652 |
| 7,466,545 | B2 | * | 12/2008 | Hung | ...................... G06F 1/181 361/679.48 |
| 7,654,391 | B2 | * | 2/2010 | Langer | ............... B65D 51/1611 206/521.1 |
| 9,722,404 | B2 | * | 8/2017 | Beele | ...................... H02G 3/22 |

(Continued)

*Primary Examiner* — Timothy J Thompson
*Assistant Examiner* — Michael A Matey
(74) *Attorney, Agent, or Firm* — Fogarty LLP (57) ABSTRACT

A foam sealing block is provided for sealing a cable channel by which one or more cables traverse into an air-cooled compartment. The foam sealing block may folded around the cables and positioned within the cable channel. The insertion of the folded foam sealing block prevents the transfer of air from the air-cooled compartment via the cable channel, while still allowing the cables to traverse the cable channel. The top surface of the foam sealing block may formed from offset rows of protrusions, such as hemispherical shaped protrusions. The dimensions and shape of the protrusions may be selected based on the physical characteristics of the cables traversing the cable channel. The bottom surface of the foam sealing block may be formed from a perforated, rigid bracket that allows the foam sealing block to fit securely within the cable channel.

20 Claims, 8 Drawing Sheets

(56) References Cited

U.S. PATENT DOCUMENTS

| | | | |
|---|---|---|---|
| 2003/0074859 A1* | 4/2003 | Reichert | E06B 3/66323 52/786.13 |
| 2006/0127648 A1* | 6/2006 | De Luca | A61B 8/12 428/174 |
| 2007/0109742 A1* | 5/2007 | Hopton | G06F 1/20 361/699 |
| 2008/0290611 A1* | 11/2008 | Dukes | H02G 3/22 277/637 |
| 2009/0000625 A1* | 1/2009 | Alfery | A61F 5/30 128/878 |
| 2009/0195978 A1* | 8/2009 | Hu | H05K 7/20727 361/679.48 |
| 2011/0255238 A1* | 10/2011 | Tan | G06F 1/183 361/679.48 |
| 2013/0102237 A1* | 4/2013 | Zhou | G06F 1/189 454/184 |
| 2015/0077935 A1* | 3/2015 | Wright | H05K 7/20181 361/695 |
| 2015/0116923 A1* | 4/2015 | Skirmont | H05K 7/1492 361/679.31 |
| 2015/0268430 A1* | 9/2015 | Bringuier | G02B 6/443 385/113 |
| 2016/0041590 A1* | 2/2016 | Yu | G06F 1/185 361/679.32 |
| 2016/0044832 A1* | 2/2016 | Lewis | H05K 7/20172 454/184 |
| 2016/0368436 A1* | 12/2016 | Wakabayashi | B60R 16/0215 |

\* cited by examiner

AIRFLOW SEALING SOLUTION

FIELD

This disclosure relates generally to airflow cooling within an Information Handling System (IHS), and more specifically, to sealing an airflow cooled compartment of an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to internal components of the IHS and away from the internal components, an IHS may utilize a cooling fan, or a plurality of cooling fans organized within an airflow cooling system. As temperatures within the IHS increase, the cooling fans may be used to ventilate heated air from within the IHS, or from within certain internal compartments of the IHS. Certain IHSs may utilize a single cooling fan to ventilate heated air from within the IHS. Other IHSs may utilize complex airflow cooling systems that include one or more banks of cooling fans and a fan controller than is used to monitor and control the cooling fans.

The enclosure and chassis of the IHS may be configured such that the internal volume of the IHS is subdivided into multiple internal compartments. In certain scenarios, the processor(s) of the IHS may be located within one of these internal compartments. In such configurations, the cooling system of the IHS may include one or more cooling fans that can be used to ventilate heated air from within this internal compartment of the IHS that includes the processor(s). An IHS includes numerous cables and wires that may be used for carrying electrical signals and/or for supplying power. In certain IHS configurations, these cables and wires may be connected to components of the IHS that are located within an air-cooled compartment of the IHS. The crossing of these cables and wires into an air-cooled compartment of the IHS may result in air gaps that reduce the effectiveness of the cooling fan system in ventilating heated air from within the air-cooled compartment.

SUMMARY

In various embodiments, an IHS (Information Handling Systems) includes a first compartment comprising one or more processors, wherein the first compartment comprises a cable channel for traversing one or more cables into the first compartment; one or more cooling fans configured to ventilate air from within the first compartment; and a foam sealing block, wherein the foam sealing block is folded around the one or more cables, and wherein the folded foam sealing block is positioned within the cable channel such that the one or more cables traverse the cable channel, and wherein the transfer of air from the first compartment via the cable channel is blocked by the folded foam sealing block.

A various additional embodiments, a sealing block is provided for sealing a cable channel for traversing one or more cables into an air-cooled compartment, wherein the foam sealing block is folded around the one or more cables, and wherein the folded foam sealing block is positioned within the cable channel such that the one or more cables traverse the cable channel, and wherein the transfer of air to the compartment via the cable channel is blocked by the folded foam sealing block.

A various additional embodiments, a method is provided for sealing a cable channel for traversing one or more cables into an air-cooled compartment, the method comprising: folding a foam sealing block around the one or more cables; and positioning the folded foam sealing block within the cable channel such that the one or more cables traverse the cable channel, and wherein the transfer of air to the compartment via the cable channel is blocked by the folded foam sealing block.

In certain additional embodiments, the top surface of the foam sealing block is formed from a plurality of rows of protrusions. In certain additional embodiments, the protrusions are hemispherical shaped protrusions. In certain additional embodiments, the protrusions of each of the plurality of rows are offset from the protrusions of neighboring rows of the plurality of rows. In certain additional embodiments, the bottom surface of the foam sealing block comprises a rigid bracket. In certain additional embodiments, a width of the rigid bracket correspond to a width of the cable channel. In certain additional embodiments, the rigid bracket comprises foldable portions that allow the foam sealing block to be folded to fit in the cable channel. In certain additional embodiments, the foldable portions of the rigid bracket are defined by perforations in the rigid bracket. In certain additional embodiments, a size of the protrusions is selected based on a diameter of the one or more cables.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Figure 1:
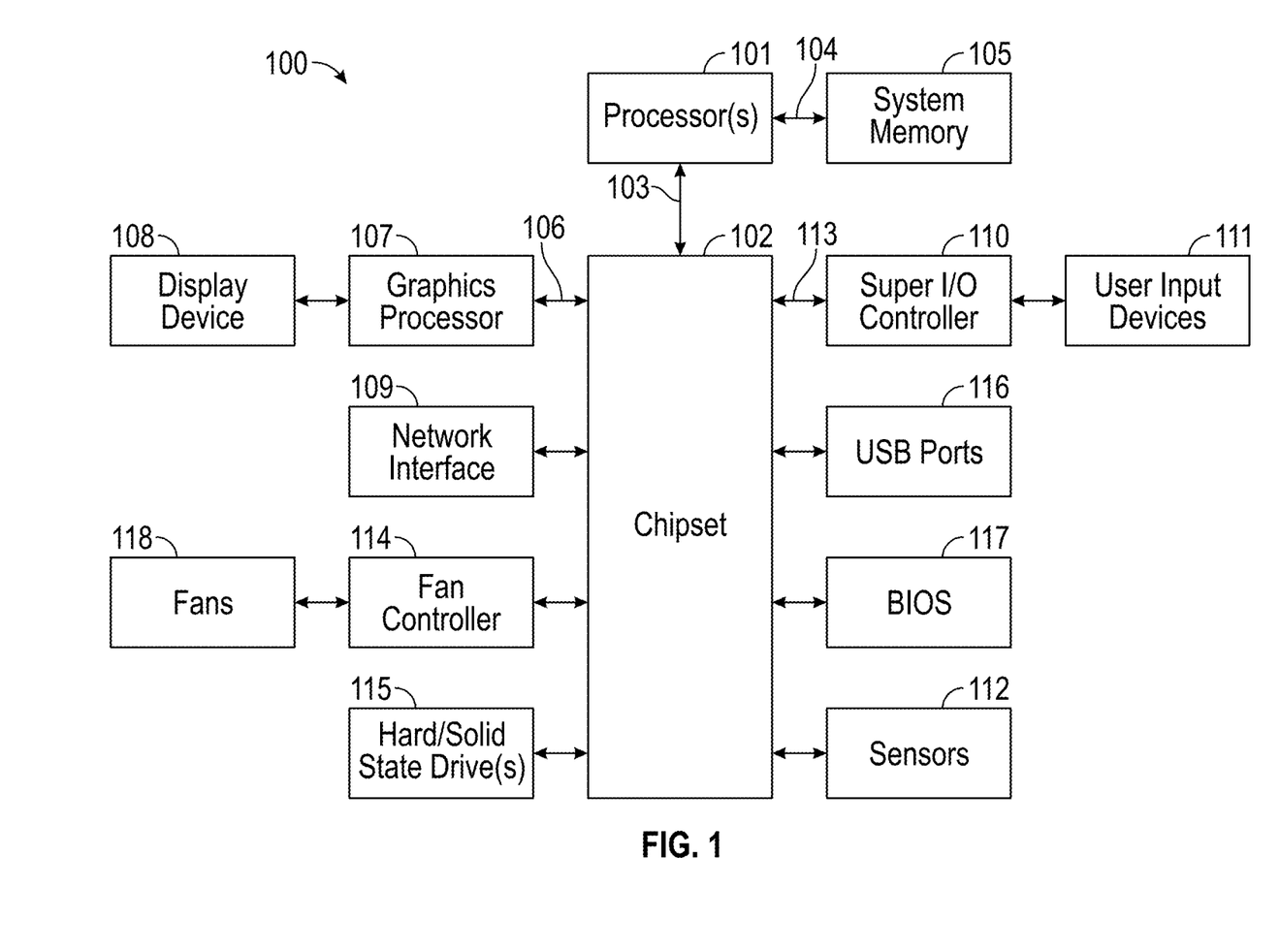
FIG. 1 is a block diagram depicting certain components of an IHS configured according to various embodiments.

FIG. 1 is a block diagram of an IHS 100 configured according to certain embodiments. IHS 100 may include one or more processors 101. In various embodiments, IHS 100 may be a single-processor system including one processor 101, or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs). IHS 100 includes a system memory 105 that is coupled to processor 101 via a memory bus 104. System memory 105 provides processor 101 with a high speed memory that may be used in the execution of computer program instructions by the processor 101. Accordingly, system memory 105 may include one or more memory modules, such as SDRAM (Synchronous Dynamic Random-Access Memory), suitable for supporting high-speed memory operations by the processor 101.

IHS 100 includes a chipset 102 that may include one or more integrated circuits that are connect to processor 101. In certain embodiments, the chipset 102 may utilize a QPI (QuickPath Interconnect) bus 103 for communicating with the processor 101. In the embodiment of FIG. 1, chipset 102 is depicted as a separate component from processor 101. In other embodiments, all of chipset 102, or portions of chipset 102 may be implemented directly within the integrated circuitry of the processor 101. Chipset 102 provides the processor 101 with access to a variety of resources provided by peripheral components that are coupled to IHS 100.

Chipset 102 may provide access to a graphics processor 107. In certain embodiments, graphics processor 107 may be comprised within one or more video or graphics cards that have been installed on IHS 100. Graphics processor 107 may be coupled to the chipset 102 via a graphics bus 106 such as provided an AGP (Accelerated Graphics Port) bus or a PCI (Peripheral Component Interconnect or) bus. In certain embodiments, graphics processor 107 generates display signals and provides them to a coupled display device 108.

In certain embodiments, chipset 102 may also provide access to one or more user input devices 111. In such embodiments, chipset 102 may be coupled to a super I/O controller 110 that provides interfaces for variety of user input devices 111, in particular lower bandwidth and low data rate devices. For instance, chipset 110 may provide access to a keyboard and mouse or other peripheral input devices. In certain embodiments, chipset 110 may be used to interface with coupled user input devices 111 such as keypads, biometric scanning devices, and voice or optical recognition devices. In certain embodiments, super I/O controller 110 may also provide an interface for communication with one or more sensor devices 112, which may include environment sensors, such as a temperature sensor or other cooling system sensor. The I/O devices, such as the user input devices 111 and the sensor devices 112, may interface super I/O controller 110 through wired or wireless connections. In certain embodiments, the super I/O controller 110 may be coupled to the super I/O controller 110 via a Low Pin Count (LPC) bus 113.

In the illustrated embodiment, the chipset 102 also provides access to a fan controller 114 that is used to operate a cooling system comprised of one or more cooling fans 118. The fan controller 114 may be configured to interoperate with one or more environmental sensors 112 in order to monitor temperature conditions at one or more internal locations within the IHS 100. Based on temperature measurements collected by sensors 112, the fan controller 114 may activate and/or increase the speed of cooling fans 118 in order to ventilate heated air from within the IHS 100.

Other resources may also be coupled to IHS 100 through the chipset 102. In certain embodiments, chipset 102 may be coupled to a network interface 109, such as provided by a Network Interface Controller (NIC). According to various embodiments, network interface 109 may support communication via various wired and/or wireless networks. Chipset 102 may also provide access to one or more hard disk and/or solid state drives 115. In certain embodiments, access may be provided to an optical drive 114 or other removable-media drive. Any or all of the drive devices 114 and 115 may be integral to the IHS 100, or may be located remotely from the IHS 100. In certain embodiments, access may be provided to one or more Universal Serial Bus (USB) ports 116.

Another resource that may be accessed by processor(s) 101 via chipset 102 is BIOS 117. The BIOS 117 provides an abstraction layer for interfacing with certain hardware components that are utilized by IHS 100. Via this hardware abstraction layer provided by BIOS 117, the software executed by the processor(s) 101 of IHS is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. Upon booting of the IHS 100, processor(s) 101 may utilize BIOS 117 instructions to initialize and test hardware components coupled to the IHS and to load an Operating System (OS) for use by the IHS 100. In certain embodiments, the BIOS may be replaced, in full or in part, by a baseboard management controller (BMC) or another in-band or out-of-band controller that supports remote administration of IHS 100.

Not all IHSs 100 include each of the components shown in FIG. 1, and other components not shown may exist. Furthermore, some components shown as separate may exist in an integrated package or be integrated in a common integrated circuit with other components. For example, various of the resources provided via chipset 102 may instead be integrated into the one or more processor(s) 101 as a system-on-a-chip.

Figure 2:
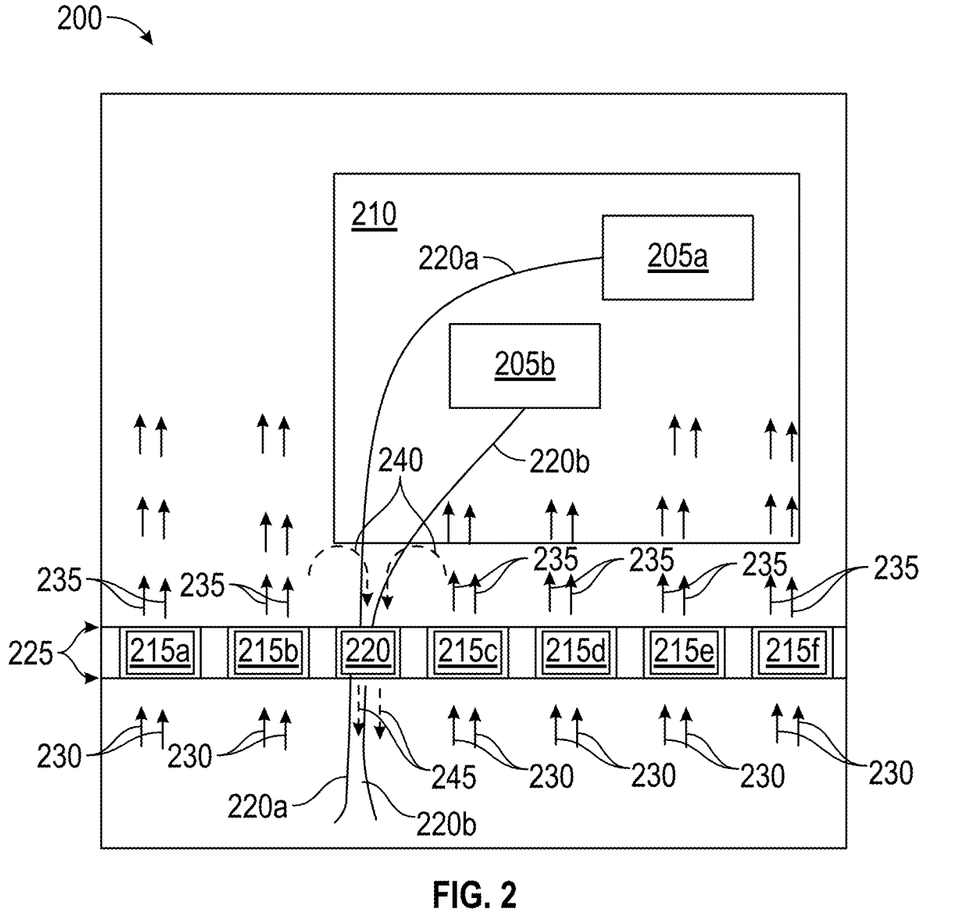
FIG. 2 is an illustration depicting the airflow within an IHS utilizing a cooling fan system and a cable channel.

As described, an IHS may utilize an airflow cooling system comprised of multiple cooling fans that ventilate heated air from within the internal compartments of the IHS. FIG. 2 is an illustration depicting the airflow within an internal compartment 200 of an IHS that utilizes a system of cooling fans 215a-f and a cable channel 220 for crossing cables 220a, 220b into the internal compartment 200. As illustrated, the airflow cooling system includes six cooling fans 215a-f. In the illustrated configuration, the cooling fans 215a-f are organized into two banks of fans, the first bank comprised of cooling fans 215a-b and the second bank comprised of cooling fans 215c-f.

Other IHSs may utilize different numbers of cooling fans, with some IHSs utilizing only a single cooling fan. In IHSs that utilize multiple cooling fans, the fans may be organized in any physical configuration besides the two-bank configuration illustrated in FIG. 2. In certain IHSs, the cooling fans 215a-f may be attached to, or enclosed within, a fan housing 225 that is attached to the chassis of the IHS secures each of the individual fans. The construction and installation of the fan housing 225 may result a relatively airtight seal with the other portions of the chassis and the enclosure of the IHS that together define the volume of the internal compartment 200.

Based on the relatively airtight installation of the fan housing 225 and the similarly sealed configuration of the other portions of the chassis and the enclosure that form the internal compartment 200 of the IHS, a relatively sealed chamber may be created within the internal compartment 200. In the illustrated IHS, the internal compartment 200 includes two processing components 205a-b that are mounted to motherboard 210. Various additional components may also be located on the motherboard 210. When operated, the processing components 205a-b and other components located on the motherboard 210 and elsewhere within the internal compartment 200 may generate heat, which is dissipated into the surrounding air of the internal compartment, in certain instances with the assistance of heat sinks, heat pipes and/or other heat exchange components.

In the configuration of FIG. 2, the first bank of cooling fans 215a-b is separated from the second bank of cooling fans 215c-f by a cable channel 220 portion of the cooling fan housing 225. In the illustrated scenario, two cables 220a-b traverse the housing 225 and cross into the internal compartment 200 via the cable channel 220. In the illustrated scenario, the cables 220a-b are depicted as connecting to processing components 205a-b. In other scenarios, the cables 220a-b may be connect to others component within the internal compartment 200 of the IHS, including other components located on the motherboard 200 of the IHS. In other scenarios, the cables 220a-b may be referred to as wires or my any other physical medium used for transmitting signals, energy and/or power.

Although the fan housing 225 and other elements that form the internal compartment 200 may be sealed together relatively tightly, the internal compartment 200 may also include one or more exhaust vents. The cooling fans 215a-f may ventilate the internal compartment 200 by pushing air out of these vents. In some scenarios, the vents may be slots or similar openings in the enclosure and chassis of the IHS. In other scenarios, such a blade server that host arrays of storage drives plugged into drive bay slots, the venting provided for an internal compartment of an IHS may consists of the gaps between storage drives or other components that protrude from the internal compartment. In certain scenarios, rather than push heated air out through these vents, the cooling fans may instead be configured to draw in air through these vents and pull heated air out of the internal compartment.

FIG. 2 illustrates the direction of airflow that may be used to ventilate the internal compartment 200 based on the airflow resulting from the operation of cooling fans 215a-f. As illustrated, the operation of cooling fans 215a-f may result in the cooling fans drawing in ambient air in as indicated by arrows 230. In certain scenarios, ambient air 230 drawn in by cooling fans 215a-f is ambient air drawn from an external air inlet or other opening that provides a pathway for ambient air to be pulled in by the cooling fans. As illustrated, the operation of the cooling fans 215a-f serves to force the cooler ambient air 230 into the internal compartment 200 as indicated by arrows 235. This forced air 235 serves to displace heated air from within the internal compartment 200, in particular away from processors 205a-b and other components installed within the internal compartment 200. The heated air that is displaced by forced air 235 may be ventilated from within the internal compartment 200 via vents or other exhaust openings in the internal compartment. In certain scenarios, the cooling fans 215a-f may instead be configured to draw heated air from the internal compartment 200 resulting the airflow in the direction opposite to arrows 230 and 235.

However, FIG. 2 also illustrates undesirable airflow 240 and 245 that may result through gaps in the cable channel 220. In addition to drawing ambient air 230 and pushing forced air 235 into internal compartment 200, the operation of cooling fans 215a-f may also result in air being drawn through the cable channel 220, as illustrated by arrows 240 and 245 in FIG. 1. As described below, the crossing of cables 220a-b through the cable channel 220 may result in air gaps through the cable channel that allow a portion of the forced air 235 generated by cooling fans 215a-f to escape 240 and 245 through these gaps in the cable channel 220 rather than ventilate heated air from within the internal compartment 200. For instance and as illustrated in FIG. 2, cooling fan 215c forces ambient air 230 into the internal compartment 200, but a portion of the forced air 235 output of cooling fan 215c escapes 240 and 245 directly though gaps in the cable channel 220, thus diminishing the cooling provided by cooling fan 215c. A certain portion of the forced air 235 output of cooling fan 215b likewise escapes 240 and 245 directly via the gaps in the cable channel 220, also diminishing the cooling provided by this fan. Based on the various physical aspects of the internal compartment 200 and the components therein, the other cooling fans 215a,d-f may also lose cooling efficiency through the escape 240 and 245 of forced air 235 through the cable channel 220.

In certain scenarios, the escape 240 and 245 of forced air 235 through gaps in the cable channel 220 may result in the creation of a suction effect, the exacerbates the flow of air though these gaps in the cable channel 220, resulting in the loss of additional forced air 235 output through the cable channel. In certain scenarios, a portion of the airflow that escapes 240 from the cable channel 220 may mix with the ambient air 230 and be drawn back in by cooling fans 215a-f. This may also result in a certain amount of heated air escaping 235 and 240 though the cable channel 220, only to be drawn back into the internal compartment 200 by the cooling fans 215a-f. In this manner, any gaps in the cable channel 220 allow forced air 235 to escape 240 and 245 without displacing heated air from within the internal compartment 200, such that the cooling efficiency provided by the cooling fans 215a-f may be significantly diminished.

Figure 3A:
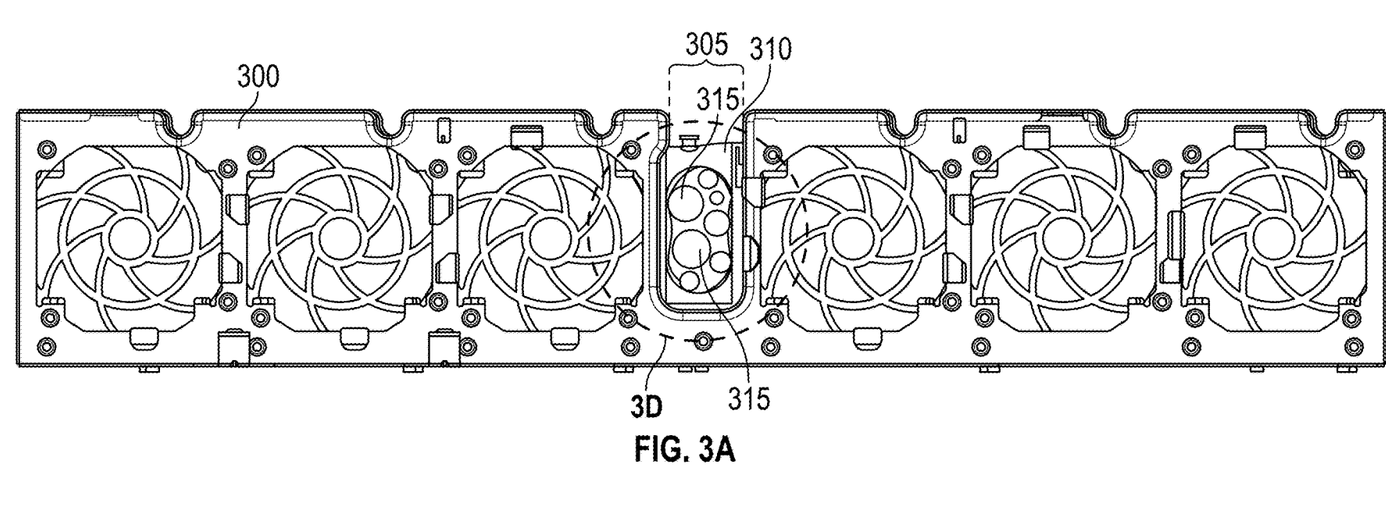
FIG. 3*a* is an illustration of a housing for two banks of cooling fans separated by a cable channel that utilizes a cable channel transition guide.

FIG. 3a is an illustration of one view of a housing 300 that consists of two banks of three cooling fans. In FIG. 2, the housing 225 is depicted from a top-down perspective. In FIG. 3a, the housing 300 is depicted from a rear facing or front facing perspective. The two banks of cooling fans are separated in the housing 300 by a cable channel 305. In the illustrated configuration, a cable channel transition guide 310 is inserted into the cable channel 305. Also illustrated are a cross-section of a set of cables 315 that traverse the cable channel 305 via the cable channel transition guide 310. Similar to the cables 220a-b of FIG. 2, the cables 315 traverse the cable channel 305 and enter into an internal compartment of an IHS that is cooled by cooling fans that are secured to the housing 300.

Figure 3B:
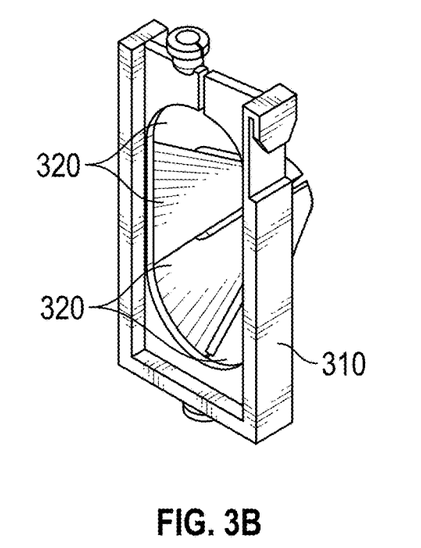
FIG. 3*b* is an illustration of a cable channel transition guide.

FIG. 3b is a close-up illustration of a cable channel transition guide 310. As illustrated, the cable channel transition guide 310 includes several flaps 320 that may be bent at their proximal ends to create a space that allow cables to be passed through the center of the cable channel transition guide 310. Accordingly, the flaps 320 of the cable channel transition guide 310 may be formed from a rubber or a deformable plastic material that can be displaced by the insertion of a cable into the opening in the center portion of the cable channel transition guide 310 that is formed by the flaps 320 that surround the central opening. The outer portion of the cable channel transition guide 310 may be formed from a rigid plastic that is configured to slide into the cable channel 305 provided by the housing 300.

Figure 3C:
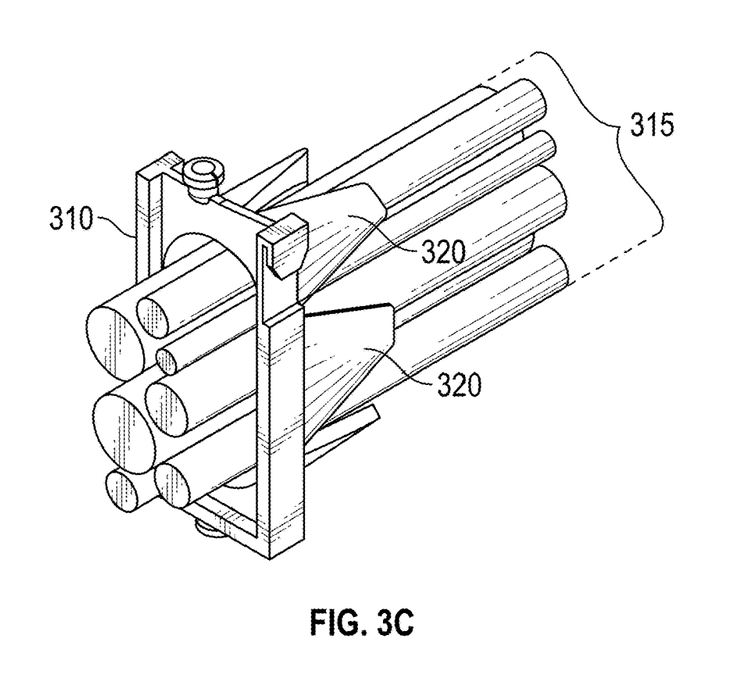
FIG. 3*c* is an illustration of a cable channel transition guide that is being traversed by a group of cables.
Figure 3D:
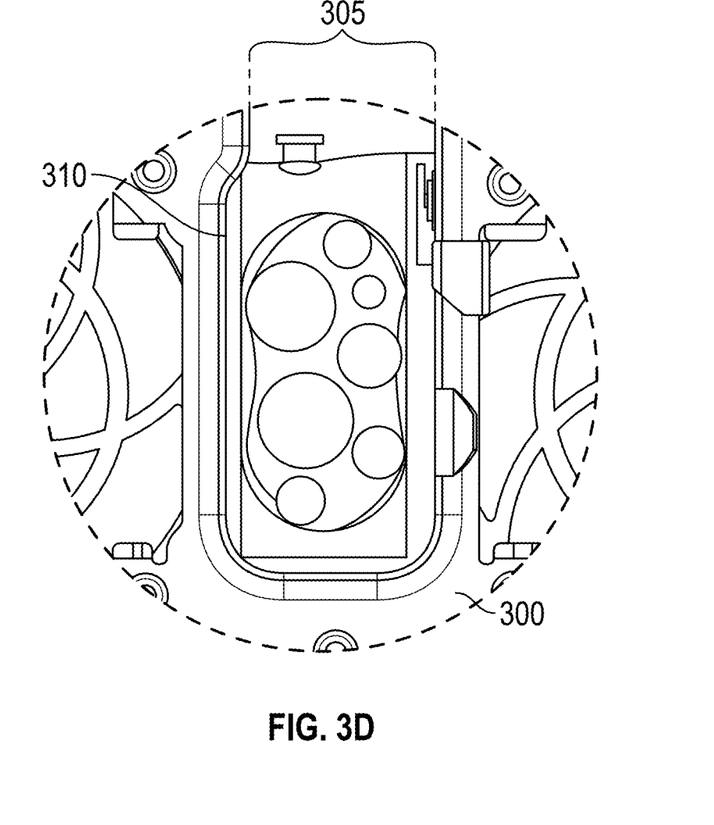
FIG. 3*d* is a close-up illustration of a cable channel transition guide that is located within a cable channel and that is being traversed by a group of cables.

FIG. 3c is an illustration of a cable channel transition guide 310 that is traversed by a group of cables 315. As illustrated, the insertion of the cables 315 results in the deformation of the flaps 320 of the cable channel transition guide 310, thus allowing the cables 315 to traverse the opening created in the center of the cable channel transition guide 310. FIG. 3d is a close-up illustration of a cable channel transition guide 300 that has been inserted in the cable channel 305 of housing 300. As illustrated, a group of cables has been inserted into the cable channel transition guide 310 leaving gaps between the cables and gaps between the cables and the cable channel transition guide 310. Each such gap provides a passageway for air to escape through the cable channel 305.

In the scenario illustrated in FIGS. 3a and 3d, the cables that traverse the cable channel transition guide 310 are not packed tightly together as they traverse the cable channel transition guide 310, thus providing the opportunity for relatively large gaps between and around the cables. Any such gaps provide a pathway for air to escape through the cable channel 305 instead of providing cooling within the compartment being cooled by the fans mounted to the housing 300. In other scenarios, the cables may be packed more tightly together in order to remove some of the gaps between and around the cables as they traverse the cable channel transition guide 310. However, regardless of the tightness of the packing of cables within the cable channel transition guide 310, air gaps can be expected to remain for all arrangements cables as they traverse the cable channel transition guide 310.

In certain scenarios, measurable spacing between the cables as they traverse the cable channel 305, such as the spacing between the cables illustrated in FIG. 3d, may be required and/or advantageous. In some scenarios, certain spacing between individual cables within the cable channel 305 may be dictated based on various cable management techniques that may be employed on both sides of the cable channel transition guide 310. In certain scenarios, significant spacing between the cables, such as illustrated in FIG. 3d, may be desirable in order to mitigate the build-up of heat between certain cables, such as between power cables. In other scenarios, such gaps between cables may be desirable in order to reduce the amount of electro-magnetic interference between certain cables.

For all arrangements of cables, the cable channel transition guide 310 may itself provide pathways for air to escape through the cable channel 305. As illustrated in FIG. 3c, the insertion of the cables 315 through the cable channel transition guide 310 results in the flaps 320 of the cable channel transition guide 310 being bent outward from their proximal ends. By the flaps 320 being pushed outward by the inserted cables, the distal ends of each of the flaps 320 is pushed further from the distal ends of the neighboring flaps, thus opening up gaps between each of the flaps 320, and thus providing additional pathways for air to escape through the cable channel 305.

Figure 4A:
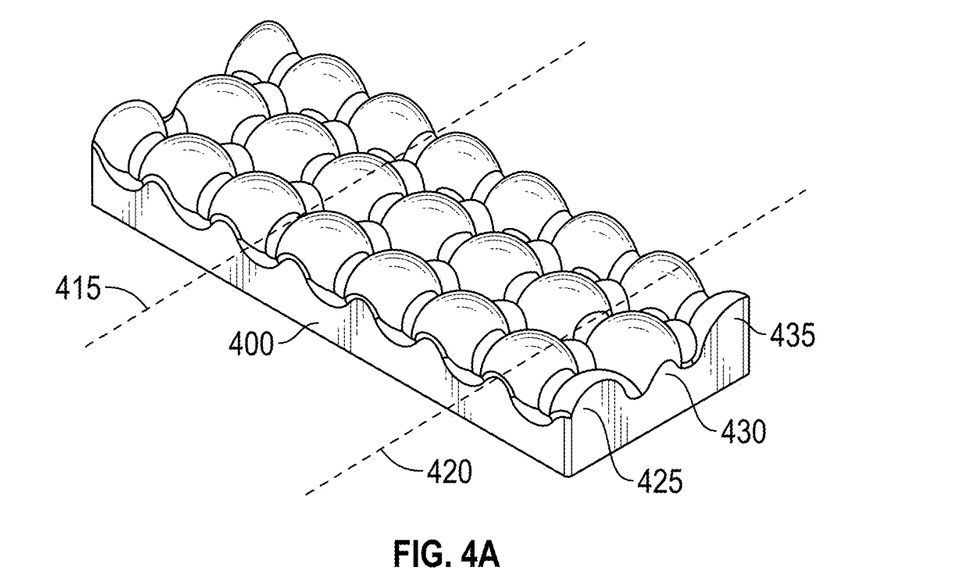
FIG. 4a is an illustration of a foam block according to various embodiments for sealing a cable channel of an IHS.

FIG. 4a is an illustration of a foam sealing block 400, according to various embodiments, that may be used to provide a relatively airtight seal in a cable channel of an IHS, while still allowing a group of cables to traverse the cable channel. The dimensions of the foam sealing block 400 may be selected in order to provide a relatively airtight seal for a particular cable channel. As described, an IHS may include a housing, or similar internal structure, that includes a cable channel that provides a passageway for cables to cross into an internal, air-cooled compartment of the IHS. The dimensions of a foam sealing block 400 may be selected to correspond to the dimensions of a specific type of cable channel that may be found in a particular IHS, or a cable channel found in a particular family or other type of IHS.

Figure 4B:
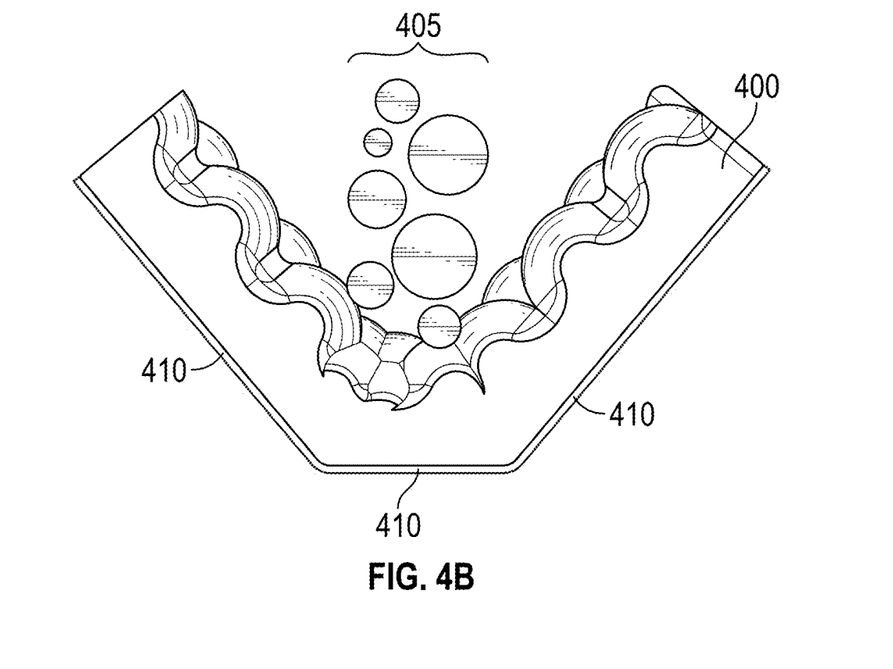
FIG. 4b is an illustration of a foam block according to various embodiments that is being folded around a group of cables.

The foam sealing block 400 may be constructed using a foam or similar deformable material that may be used to provide a relatively airtight barrier, while still deforming around a variety of cables that may be encased within the foam sealing block 400 as it is folded against itself, as illustrated in FIG. 4b. In certain embodiments, the foam material of the foam sealing block 300 may be coated or otherwise treated in order to reduce the porosity of the surface of the foam material, thus improving the sealing abilities of the foam sealing block 400. The coating and/or treatment applied to the foam sealing block 400 may also serve to protect the foam material from damage and wear, thus improving the longevity of the foam sealing block 400.

In the illustrated embodiment, the top surface of the foam sealing block 400 is formed from a network of interconnected hemispherical protrusions. As illustrated in FIG. 4a, each hemispherical foam protrusion is connected to certain neighboring protrusions via a raised foam structure that extends between the connected protrusions. The hemispherical protrusions that form the foam sealing block 400 may be described as being organized in a series of rows. In FIG. 4a, a first row 425 is formed by a set of hemispherical protrusions that are each connected to the two neighboring hemispherical protrusions from this same row 425 via raised foam connecting structures. Similarly, in a second row 430, each of those hemispherical protrusions are likewise connected to the two neighboring hemispherical protrusions from that same row 430. In addition to being connected to hemispherical protrusions from the same row, each of the hemispherical protrusions is likewise connected to two more protrusions from neighboring rows. For instance, each of the hemispherical protrusions from row 430 is connected by a raised foam structure to the two closest hemispherical protrusions from neighboring row 425 and is also connected to the two closest hemispherical protrusions from neighboring row 435. In other embodiments, different numbers and types of raised connections may be utilized between neighboring protrusions.

As illustrated in FIG. 4a, each of the rows of hemispherical protrusions 425, 430, 435 is offset from neighboring rows. For instance, the hemispherical protrusions that form row 425 are offset from the hemispherical protrusions that form row 430, which are likewise offset from the hemispherical protrusions that form row 435. The offset configuration of rows of hemispherical protrusions is demonstrated by the reference lines 415 and 420. Reference lines 420 and 415 traverse the foam sealing block 400 in the same general direction as a cable that would be encased within the foam sealing block. As illustrated, reference line 420 intersects the highest point of a hemispherical protrusions in row 425 and then intersects with neighboring row 430 at the lowest point of the raised foam structure that connects two neighboring hemispherical protrusions from this neighboring row 430 and then intersects row 435 at the highest point of a hemispherical protrusion of that row. Reference line 415 likewise intersects with alternating high points and low points on neighboring rows, but begins by crossing row 425 at a low point between protrusions in that row.

Figure 4C:
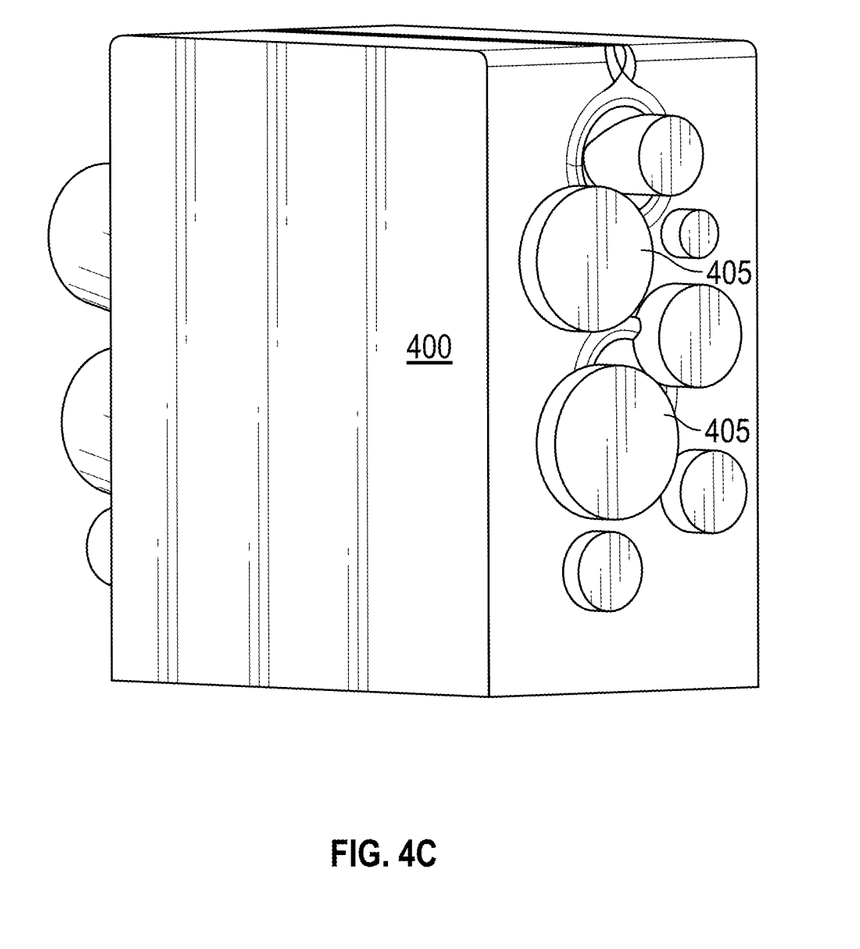
FIG. 4c is an illustration of a foam block according to various embodiments that has been folded around a group of cables.

Different embodiments of the foam sealing block may be formed using rows of protrusions with different offsets than illustrated in foam sealing block 400 of FIG. 4a. For instance, in other embodiments, the second row of protrusions 430 may be offset from the first row of protrusions 425 such that the reference line 420 does not cross from a peak of row 425 to the low point of the connection structure on row 430 and instead may cross from a peak of row 425 to a midpoint of a neighboring protrusion on row 430 and may then cross row 435 at a low point in that row. Various other offsets may be used to stagger the rows of protrusions. By offsetting the rows of protrusions in this manner, any airflow between the facing portions of the foam sealing block 400 after it has been folded, such as illustrated in FIG. 4c, is impeded by the offset arrangement of the rows of protrusions. If air is drawn into a low point on the first row 425, such as the low point of row 425 that is crossed by reference line 415, that air does not encounter a straight path in traversing the width of the foam sealing block 400 and instead encounters a foam protrusion on the second row 430. In this manner, the offset arraignment of protrusions limits the formation of air pathways that can traverse the folded foam sealing block 400.

Figure 5:
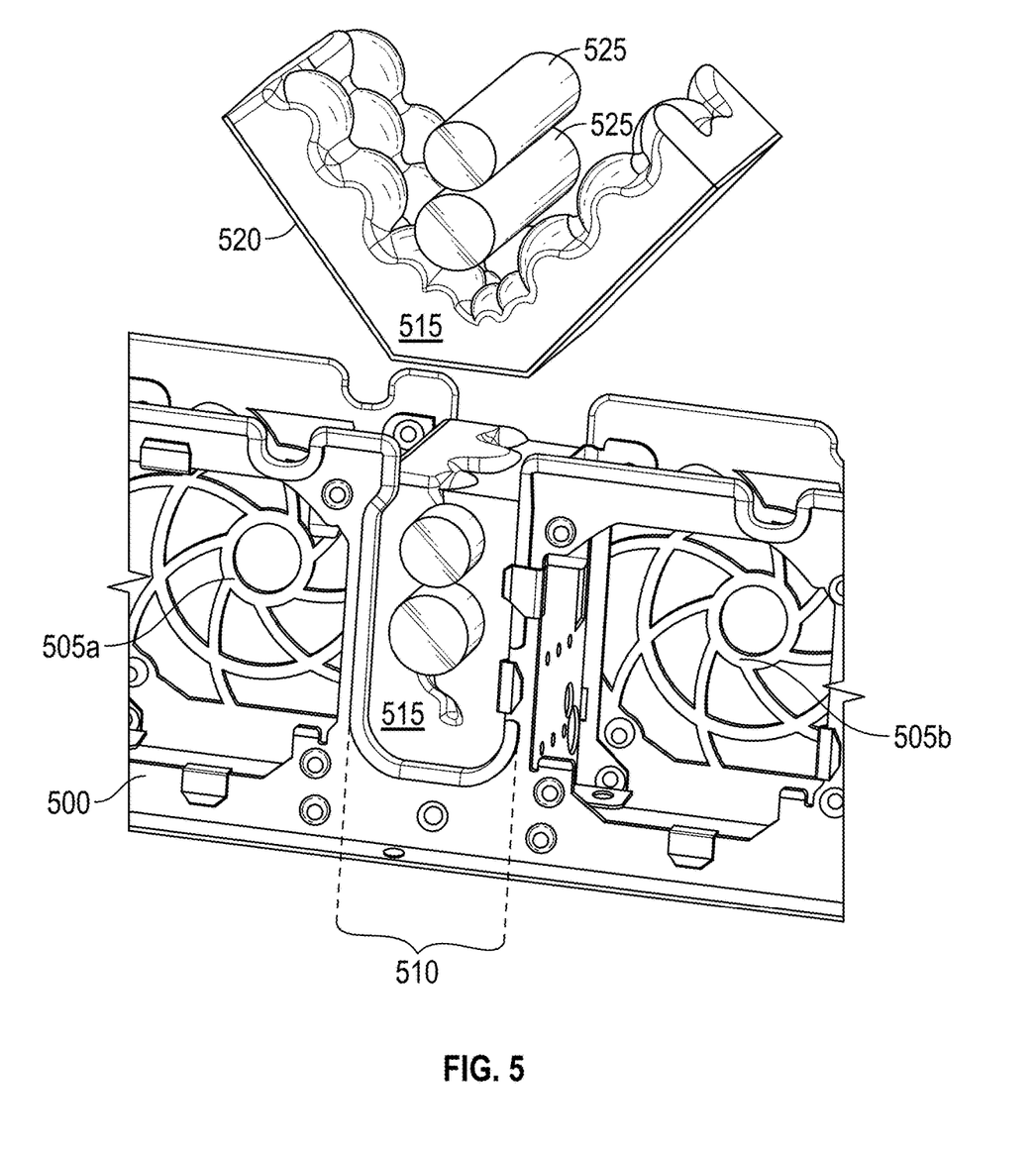
FIG. 5 is an illustration of a foam block according to various embodiments that is being folded around a pair of cables and an illustration of a foam block that has been folded around a pair of cables according to various embodiments and inserted into a cable channel of an IHS.

Various embodiments of the foam sealing block 400 may be formed with various numbers of protrusions. For instance, in certain embodiments, a foam sealing block may be formed with a large number of smaller protrusions. In other embodiments, a foam sealing block may be formed with a smaller number of larger protrusions. The number and size of protrusions present on a foam sealing block may be determined based on the diameters, or other size characteristics, of the cables that are to be encased within the foam sealing block. For instance, a foam sealing block with a small number of larger protrusions, such as illustrated in FIG. 5, may be selected in order to accommodate large diameter cables that are utilized by a particular IHS. Likewise, a foam sealing block with a larger number of smaller protrusion may be selected in order to keep smaller diameter cables tightly encased within the foam sealing block 400 as it is folded around the cables 405, as illustrated in FIG. 4b.

In the illustrated embodiments, the top surface of the foam sealing block 400 is formed from a network of hemispherical foam protrusions. In other embodiments, the foam sealing block may be formed from networks of protrusions of different geometrical shapes. For instance, certain embodiments may utilize foam protrusions that are pyramid shaped and which may be interconnected via raised foam structures in a similar manner to those that connect the hemispherical protrusions of foam sealing block 400. Other embodiments of the foam sealing block may utilize other geometrical shapes for the protrusions and connecting structures that are organized into connected networks such as in the illustrated embodiments.

FIG. 4b illustrates the folding of a foam sealing block 400 around a group of cables 405. As described, a foam sealing block 400 may be constructed from a deformable foam material that allows the foam sealing block to be folded around a group of cables and also to fit within a cable channel provided by an IHS. FIG. 4c is an illustration of the foam sealing block 400 after it has been folded around a group of cables 405. As illustrated in FIG. 4c, the foam sealing block 400 may be folded tightly around the cables 405, such that the cables 405 are encased within the foam sealing block 400. The deformation of the protrusions around the cables 405 further allows the foam sealing block 400 to be encased tightly around the cables 405, thus allowing fewer air pathways by which air can be drawn past the foam sealing block 400. FIG. 4c demonstrates the ability of the foam sealing block 400 to provide a relatively airtight seal for a combination of cables of various different diameters.

FIG. 4b also illustrates the outer bracket 410 that may be attached to the bottom surface of a foam sealing block 400 according to certain embodiments. In certain embodiments, the outer bracket 410 may be constructed from a rigid plastic. Other embodiments may utilize other rigid materials for the construction of the outer bracket 410. In certain embodiments, the outer bracket 410 may be formed as an integral portion of the foam sealing block 400 as a rigid, bottom surface portion. In other embodiments, the outer bracket 410 may be separately manufactured and attached to the bottom surface of the foam sealing block 400 using an adhesive.

In certain embodiments, the outer bracket 410 may include gaps or perforations that allow the outer bracket 410 to be predictably folded similar to the folding of the foam sealing block 400 in FIG. 4b. In the embodiment illustrated in FIG. 4b, the outer bracket 410 is formed with two gaps that allow the foam sealing block 400 to be folded with a center portion at the bottom and left and a right portions of similar lengths that may folded against each other. In other embodiments, the outer bracket 410 may include perforations that similarly allow the foam sealing block 400 to be folded with a center portion at the bottom and with left and right portions that may be folded against each other. The locations of perforations or gaps along the length of the foam sealing block 400 dictate the lengths of the center, left and right portions upon folding of the foam sealing block. These locations of the perforations or gaps, and thus the lengths of the center, left and right portions, may be selected such that when the foam sealing block 400 is folded and placed into a cable channel provided by an IHS, the foam sealing block 400 is held securely in the cable channel and the cable channel is substantially blocked by the folded foam sealing block 400.

As described with respect to FIG. 4a, the top surface of the foam sealing block 400 may be described as being formed from rows of foam protrusions. When the foam sealing block 400 is folded, the protrusions from each row remain aligned with the other protrusions that form that same row. For instance, upon folding of the foam sealing block 400, the protrusions of the left portion of row 425 will interface with the protrusions of the right portion of row 425. In certain embodiments, the folding points of the foam sealing block 400 are selected such that, when the foam sealing block 400 is folded, the protrusion on one side of the foam sealing block 400 are aligned with a low point between protrusions on the same row of the other side. By selecting the folding points of the foam sealing block 400 in this manner, the protrusions from the left and right portion interface to form an interlocking grid of protrusions that reduces the possibility of air pathways, while still accommodating the cables that are encased within the folded foam sealing block.

FIG. 5 is an illustration of a foam sealing block 515 according to various embodiments that is being folded around a pair of cables 525. FIG. 5 also includes an illustration of the folded foam sealing block 515 after it has been folded around the pair of cables 525 and inserted into a cable channel 510 of an IHS. Similar to the folding of foam sealing block 400 in FIG. 4b, in the embodiment of FIG. 5, the foam sealing block 515 is folded to form a bottom portion and left and right portions that are folded against each other to encase the cables 525 within the foam sealing block 515. In the embodiment of FIG. 5, the foam sealing block 515 includes an outer bracket 520 on its bottom surface. Unlike the three-piece outer bracket 410 of FIG. 4b, the outer bracket 520 is a single structure that covers the bottom side of the foam sealing block 515. As described, the outer bracket 520 may include perforations that determine folding points along which foam sealing block 515 may be folded in order to fit securely and closely within a specific cable channel.

FIG. 5 also illustrates the foam sealing block 515 after it has been inserted in a cable channel 510 of an IHS. In the embodiment of FIG. 5, the cable channel 510 is a portion of an internal fan housing 500 of an IHS, where the fan housing 500 includes two openings 505a and 505b that may each be use used secure a cooling fan. As described, fan housing 500 may form a portion of a sealed internal compartment of an IHS such that the cooling fans secured at openings 505a and 505b serve to ventilate heated air from within this internal compartment. The cable channel 510 provides a passage by which cables cross into the internal compartment.

As demonstrated in FIG. 5, the size of the foam sealing block 515 may be selected in order to fit closely in the cable channel 510. In addition, the outer bracket 520 of the foam sealing block 515 may also be selected so that the foam sealing block 515 fits closely and securely within the cable channel 510. For instance, the dimensions of the foam sealing block 515 and the outer bracket 520 may be selected such that, when folded, the foam sealing block 515 can be slid into the cable channel 510 in order to substantially block the flow of air through the cable channel 510, while still deforming around the encased cables 525 to allow the cables to traverse the cable channel 510.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An IHS (Information Handling Systems) comprising:
a first compartment comprising one or more processors;
one or more cooling fans configured to ventilate air from within the first compartment, wherein the cooling fans are housed within a fan housing comprising a cable channel for traversing one or more cables into the first compartment; and
a foam sealing block, wherein the foam sealing block is folded around the one or more cables, and wherein the folded foam sealing block is positioned within the cable channel of the fan housing such that the one or more cables traverse the cable channel, and wherein, upon positioning of the folded foam sealing block within the cable channel, the sealing block restricts the transfer of air via the cable channel, and wherein the top surface of the foam sealing block is formed from a plurality of rows of protrusions that restrict airflow through gaps between the foam sealing block and portions of the cables that are folded within the foam sealing block and through gaps between the portions of the cables that are folded within the foam sealing block.

2. The IHS of claim 1, wherein the protrusions are hemispherical shaped protrusions.

3. The IHS of claim 1, wherein the protrusions of each of the plurality of rows are offset from the protrusions of neighboring rows of the plurality of rows.

4. The IHS of claim 1, wherein the bottom surface of the foam sealing block comprises a rigid bracket.

5. The IHS of claim 4, wherein a width of the rigid bracket correspond to a width of the cable channel.

6. The IHS of claim 5, wherein the rigid bracket comprises foldable portions that allow the foam sealing block to be folded to fit in the cable channel.

7. The IHS of claim 6, wherein the foldable portions of the rigid bracket are defined by perforations in the rigid bracket.

8. The IHS of claim 1, wherein a size of the protrusions is selected based on a diameter of the one or more cables.

9. The IHS of claim 3, wherein the offsetting rows of protrusions restrict airflow along the portions of the cables that traverse the cable channel via the sealing block.

10. A foam sealing block for sealing a cable channel for traversing one or more cables into an air-cooled compartment, wherein the foam sealing block is folded around the one or more cables, and wherein the folded foam sealing block slides into the depth of the cable channel by which the one or more cables traverse the cable channel, and wherein, upon positioning of the folded foam sealing block within the cable channel, the sealing block restricts the transfer of air via the cable channel, and wherein the top surface of the sealing block is formed from a plurality of rows of protrusions that restrict airflow through gaps between the sealing block and portions of the cables that are folded within the sealing block and through gaps between the portions of the cables that are folded within the sealing block.

11. The foam sealing block of claim 10, wherein the protrusions are hemispherical shaped protrusions.

12. The foam sealing block of claim 10, wherein the protrusions of each of the plurality of rows are offset from the protrusions of neighboring rows of the plurality of rows.

13. The foam sealing block of claim 10, wherein the bottom surface of the foam sealing block comprises a rigid bracket.

14. The foam sealing block of claim 13, wherein a width of the rigid bracket correspond to a width of the cable channel.

15. The foam sealing block of claim 14, wherein the rigid bracket comprises foldable portions that allow the foam sealing block to be folded to fit in the cable channel.

16. The foam sealing block of claim 15, wherein the foldable portions of the rigid bracket are defined by perforations in the rigid bracket.

17. The foam sealing block of claim 16, wherein a size of the protrusions is selected based on a diameter of the one or more cables.

18. The foam sealing block claim 12, wherein the offsetting rows of protrusions restrict airflow along the portions of the cables that traverse the cable channel via the sealing block.

19. A method for sealing a cable channel for traversing one or more cables into an air-cooled compartment, the method comprising:
folding a foam sealing block around the one or more cables; and
sliding the folded foam sealing block into the depth of the cable channel such that the one or more cables traverse the cable channel, and wherein, upon positioning of the folded foam sealing block within the cable channel, the sealing flock restricts the transfer of air via the cable channel, and wherein the top surface of the foam sealing block is formed from a plurality of rows of protrusions that restrict airflow through gaps between the foam sealing block and portions of the cables that are folded within the foam sealing block and through gaps between the portions of the cables that are folded within the foam sealing block.

20. The method of claim 19, wherein the protrusions of each of the plurality of rows are offset from the protrusions of neighboring rows of the plurality of rows, and wherein the offsetting rows of protrusions restrict airflow along the portions of the cables that traverse the cable channel via the sealing block.

* * * * *